United States Patent
Sato

[11] Patent Number: 6,131,795
[45] Date of Patent: Oct. 17, 2000

[54] THERMAL COMPRESSION BONDING METHOD OF ELECTRONIC PART WITH SOLDER BUMP

[75] Inventor: Seiichi Sato, Chikushino, Japan

[73] Assignee: Matsushita Electric Industrial Co., Ltd., Osaka, Japan

[21] Appl. No.: 09/187,222

[22] Filed: Nov. 6, 1998

[30] Foreign Application Priority Data

Nov. 10, 1997 [JP] Japan .................................. 9-306863
Nov. 10, 1997 [JP] Japan .................................. 9-306864

[51] Int. Cl.[7] .............................. B23K 1/06; B23K 31/02
[52] U.S. Cl. .................. 228/102; 228/180.21; 228/234.1
[58] Field of Search .......................... 437/220; 257/73.7; 156/298; 228/102, 103, 104, 178, 179.1, 180.21, 234.1, 180.22

[56] References Cited

U.S. PATENT DOCUMENTS

| | | | |
|---|---|---|---|
| 5,059,559 | 10/1991 | Takahashi et al. ...................... | 437/220 |
| 5,193,732 | 3/1993 | Interrante et al. ........................ | 228/1.1 |
| 5,773,889 | 6/1998 | Love et al. .............................. | 257/737 |
| 5,849,132 | 12/1998 | Chiu ......................................... | 156/298 |
| 5,984,165 | 11/1999 | Inoue et al. ........................ | 228/180.22 |

*Primary Examiner*—Patrick Ryan
*Assistant Examiner*—Jonathan Johnson
*Attorney, Agent, or Firm*—Stevens, Davis, Miller & Mosher, L.L.P.

[57] ABSTRACT

A thermal compression bonding method of an electronic part with a solder bump comprises the steps of, pressing the electronic part with the solder bump to a circuit board by a thermal compression bonding tool vertically moving by vertical moving means and thermally compression bonding said electronic part to the circuit board while detecting the pressing force by load detecting means. In this method, there is included the steps of descending the thermal compression bonding tool so as to press the solder bump of said electronic part to the electrode of the circuit board, and judging that the solder bump is melted when a load detected value by said load detecting means is reduced to a value equal to or less than a predetermined value after heating of said electronic part is started so as to ascend the thermal compression bonding tool. Accordingly, it is unnecessary to wait a time-up of a supposed melting time set by a timer in accordance with a conventional method, so that a useless time can be omitted and a productivity can be improved.

2 Claims, 3 Drawing Sheets

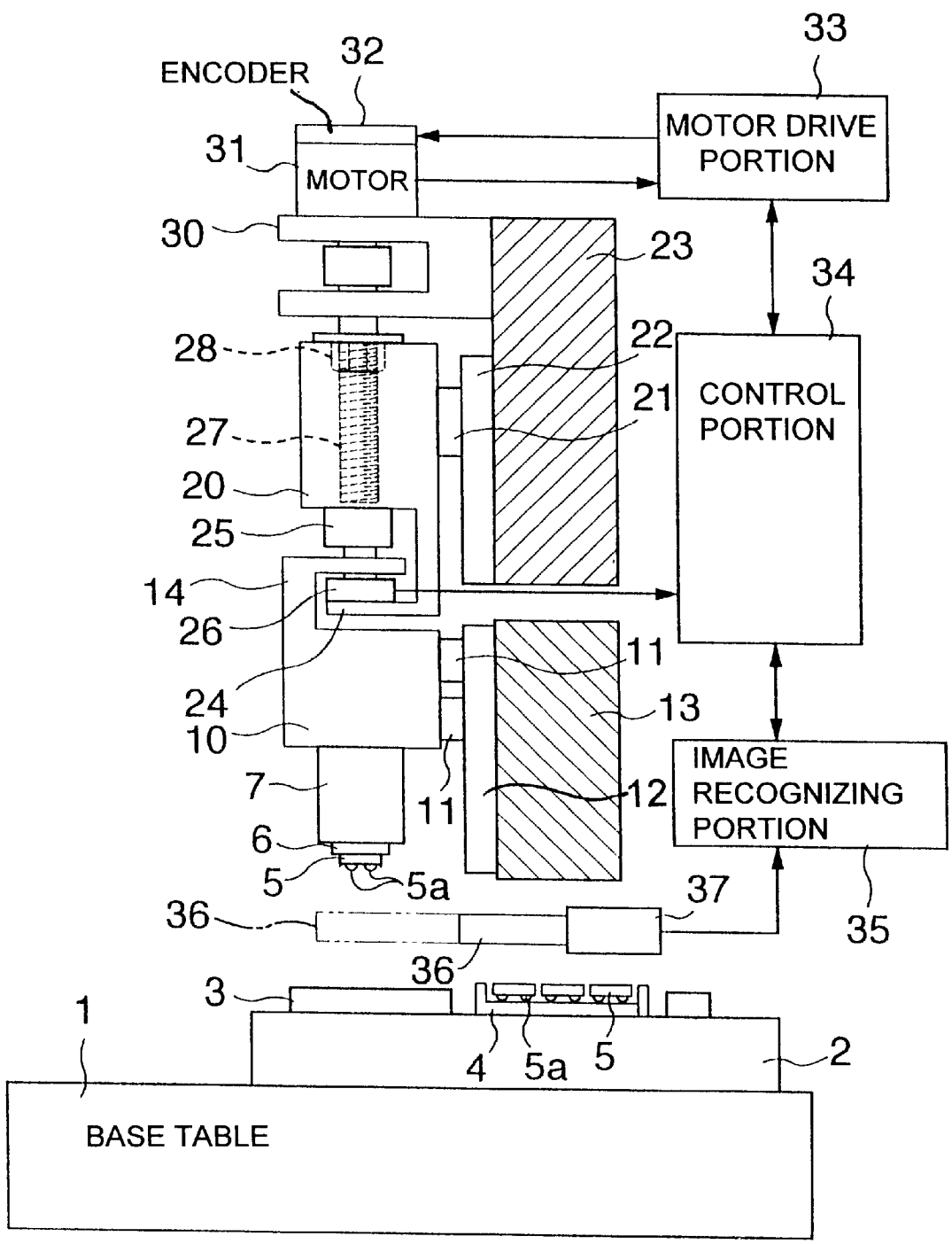

$fo = F0+W$      $fo = F0+W - F$

FIG. 3
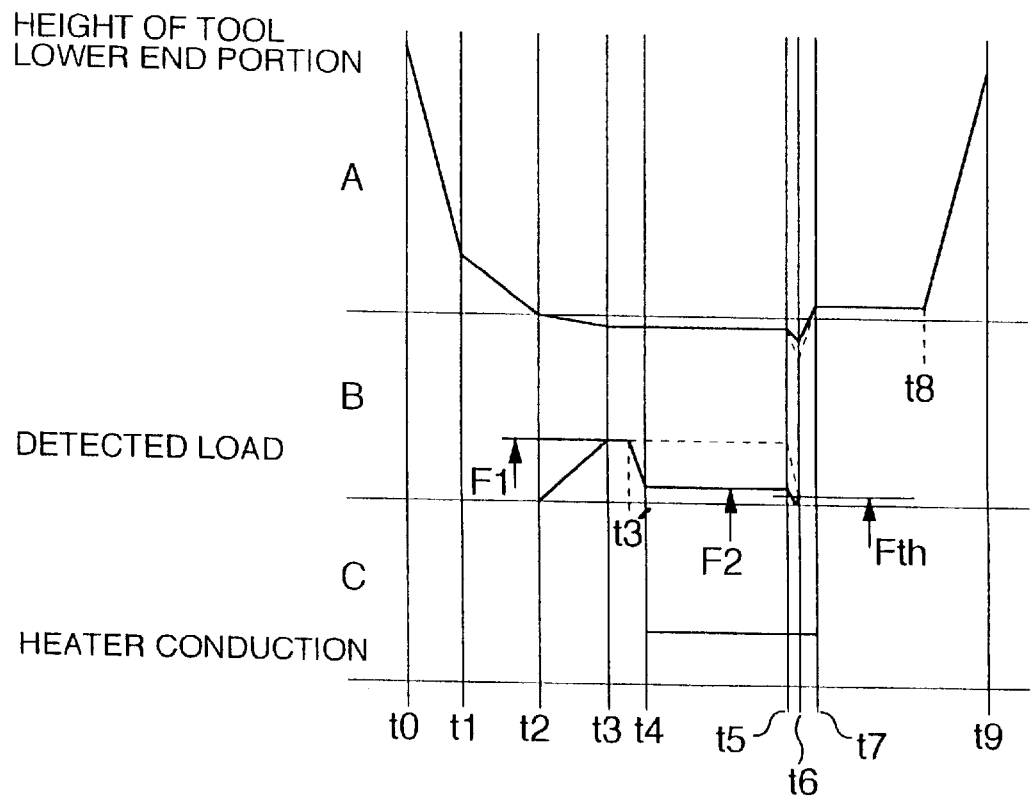
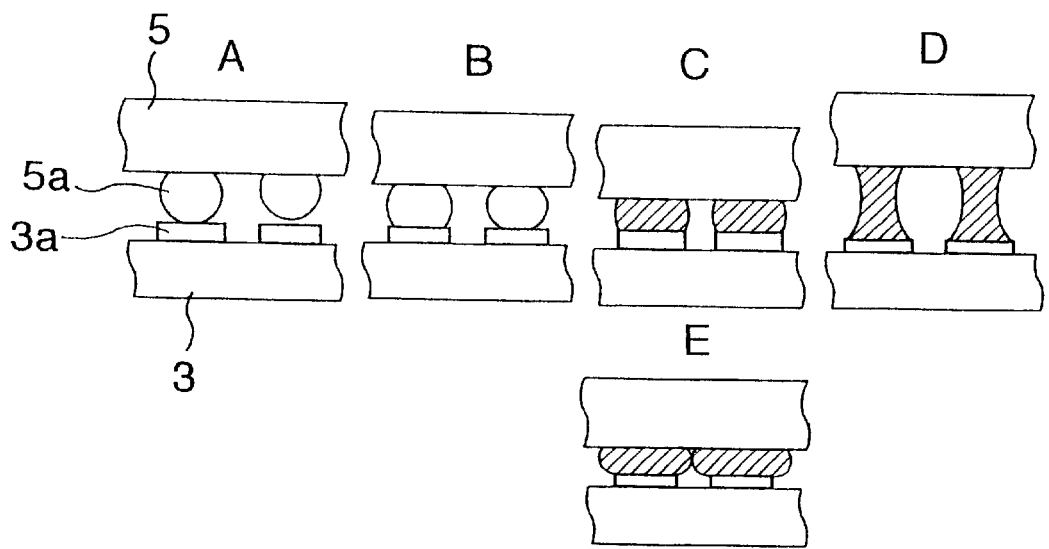

6,131,795

THERMAL COMPRESSION BONDING METHOD OF ELECTRONIC PART WITH SOLDER BUMP

BACKGROUND OF THE INVENTION

FIELD OF THE INVENTION

The present invention relates to a thermal compression bonding method of an electronic part with a solder bump for thermal compression bonding of an electronic part with a solder bump such as a flip chip and the like to a circuit board.

There has been known a method by a thermal compression bonding as a method of mounting an electronic part with a solder bump such as a flip chip and the like to a circuit board. The method is constituted by pressing the electronic part to the circuit board by a thermal compression bonding tool, heating the electronic part so as to melt the solder bump in the electronic part, and soldering to an electrode of the circuit board. In this thermal compression bonding process, when the solder bump is brought into contact with the electrode, the solder bump is at a temperature equal to or less than a melting point of the solder, and the solder bump is melted when a certain time passes after the solder bump is brought into contact.

After the solder bump is melted, it is performed to extend the melted solder to a predetermined height by slightly ascending a thermal compression bonding tool holding the electronic part. A timing of ascending the thermal compression bonding tool has been conventionally set by a timer by supposing a time required for melting the solder bump. However, in the case of setting by the timer, since the melting of the solder bump is not actually confirmed, the melting time of the solder bump is set to be a little longer so that a complete melting is secured in all the cases. Accordingly, in almost cases, in spite that the solder bump is melted before the set timing, there is generated a useless time that the thermal compression bonding tool does not ascend immediately after melting, but stands by as it is, so that there has been a problem of preventing a productivity from being improved.

Further, in this thermal compression bonding step, when the pressing is continued after the solder bump is melted, the melted solder is crushed by the thermal compression bonding tool. Accordingly, the solder bump is prevented from being crushed by fixing a height position of the thermal compression bonding tool before the solder bump is melted. However, even in a state where the height position of the thermal compression bonding tool is fixed, the thermal compression bonding tool presses the electronic part to the circuit board under a certain pressing load, and an elastic strain corresponding to the pressing load is generated in a pressing mechanism of a thermal compression bonding apparatus which receives a reaction force of the pressing load. Accordingly, at the same time when the solder bump is melted and the pressing load applied to the solder bump disappears, the elastic strain is released, so that the thermal compression bonding tool is displaced downward at a degree corresponding to the elastic strain of the pressing mechanism. In the case that an amount of this displacement is large, there is a case of crushing the melted solder bump. Therefore, there has been a problem that a disadvantage such as a bridge, that is, connection to an adjacent bump is generated in some cases.

SUMMARY OF THE INVENTION

A first object of the present invention is to provide a thermal compression bonding method of an electronic part with a solder bump which can omit a useless time at a time of thermal compression bonding and improve a productivity.

A second object of the present invention is to provide a thermal compression bonding method of an electronic part with a solder bump in which a crush by a thermal compression bonding tool is not generated when the solder bump is melted.

In accordance with the present invention, there is provided a thermal compression bonding method of an electronic part with a solder bump comprising the steps of, pressing the electronic part with the solder bump to a circuit board by a thermal compression bonding tool vertically moving by vertical moving means and thermally compression bonding said electronic part to the circuit board while detecting the pressing force by load detecting means, wherein the improvement comprises the steps of descending the thermal compression bonding tool so as to press the solder bump of said electronic part to the electrode of the circuit board by a predetermined load, and judging that the solder bump is melted when a load detected value by said load detecting means is reduced to a value equal to or less than a predetermined value after heating of said electronic part is started so as to ascend the thermal compression bonding tool.

In accordance with the present invention, a useless time at a time of thermally compression bonding can be omitted by judging that the solder bump is melted when a load detected value by said load detecting means is reduced to a value equal to or less than a predetermined value after heating of said electronic part is started so as to ascend the thermal compression bonding tool, after descending the thermal compression bonding tool so as to press the solder bump of said electronic part to the electrode of the circuit board by a predetermined load.

In accordance with the present invention, there is provided a thermal compression bonding method of an electronic part with a solder bump comprising the steps of, pressing the electronic part with the solder bump to a circuit board by a thermal compression bonding tool vertically moving by vertical moving means and thermally compression bonding said electronic part to the circuit board while detecting the pressing force by load detecting means of a strain type, wherein the improvement comprises the steps of descending the thermal compression bonding tool so as to press the solder bump of said electronic part to the electrode of the circuit board, driving said vertical moving means so that a strain of said load detecting means becomes a value equal to or less than a predetermined value before the solder bump is melted, and heating said electronic part so as to melt the solder bump.

In accordance with the present invention, an amount of downward displacement of the thermal compression bonding tool after the solder bump is melted is reduced, so that the solder bump is prevented from being crushed by driving said vertical moving means so that a strain of said load detecting means becomes a value equal to or less than a predetermined value before the solder bump is melted after descending the thermal compression bonding tool so as to press the solder bump of said electronic part to the circuit board.

BRIEF DESCRIPTION OF THE DRAWINGS

FIG. 1 is a side elevational view of a thermal compression bonding apparatus for an electronic part with a solder bump in accordance with an embodiment of the present invention;

FIG. 3 is a timing chart of a thermal compression bonding method of an electronic part with a solder bump in accordance with an embodiment of the present invention.

DESCRIPTION OF THE PREFERRED EMBODIMENTS

Figure 2A:
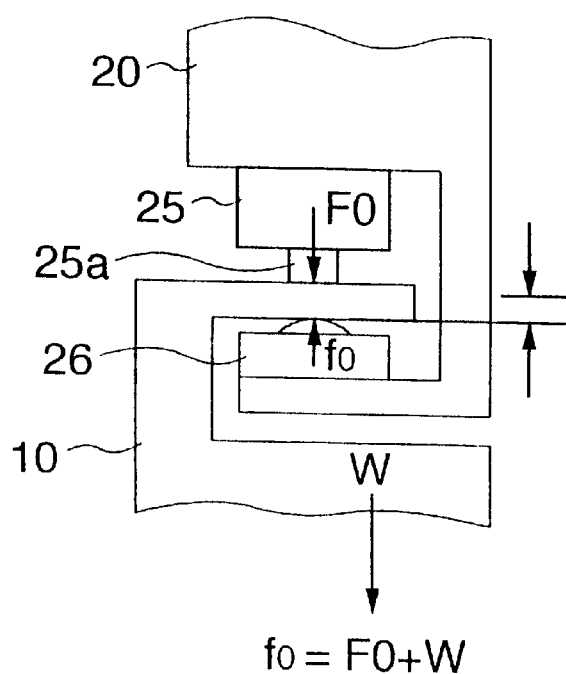
FIGS. 2A and 2B are partial side elevational views of a load detecting portion of a thermal compression bonding apparatus for an electronic part with a solder bump in accordance with an embodiment of the present invention.
Figure 2B:
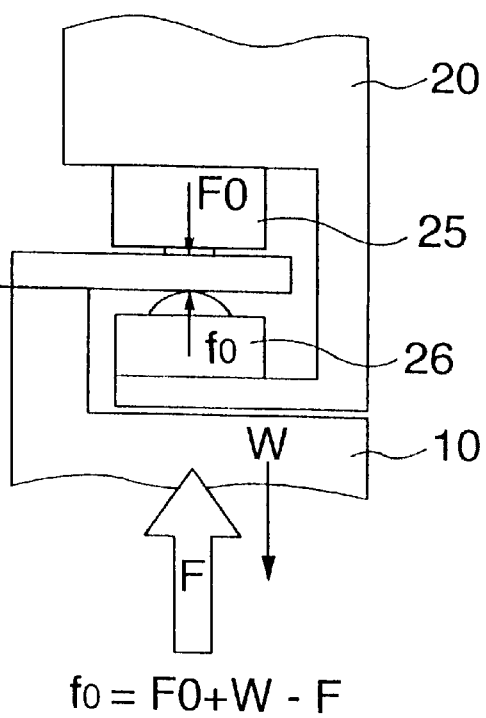

Next, an embodiment in accordance with the present invention will be described below with reference to the drawings. FIG. 1 is a side elevational view of a thermal compression bonding apparatus for an electronic part with a solder bump in accordance with an embodiment of the present. FIGS. 2A and 2B are partial side elevational view of a load detecting portion of the thermal compression bonding apparatus for the electronic part with the solder bump and FIG. 3 is a timing chart of a thermal compression bonding method of the electronic part with the solder bump.

At first, a structure of the thermal compression bonding apparatus for the electronic part with the solder bump will be described with reference to FIG. 1. In FIG. 1, a movable table 2 is provided on a base table 1. A circuit board 3 is mounted on the movable table 2, and a supply portion 4 of an electronic part 5 is arranged in the side of the circuit board 3. The circuit board 3 and the supply portion 4 move within a horizontal surface by driving the movable table 2. The electronic part 5 is held by a thermal compression bonding tool 6 above the movable table 2. The thermal compression bonding tool 6 is mounted to a compression bonding head 7, and the compression bonding head 7 is further mounted to a first vertical moving block 10.

A slider 11 is adhered to a back surface of the first vertical moving block 10, and the slider 11 is fitted to a perpendicular guide rail 12 arranged in a front surface of a first frame 13 in such a manner as to freely slide in a vertical direction. Further, an inverse-L-shaped protrusion 14 is provided in an upper portion of the first vertical moving block 10. A load cell corresponding to load detecting mean mentioned below is brought into contact with a lower surface of the protrusion 14.

A second vertical moving block 20 is provided above the first vertical moving block 10. A slider 21 is provided on a back surface of the second vertical moving block 20, and the slider 21 is fitted to a perpendicular guide rail 22 arranged in a front surface of a second frame 23 in such a manner as to freely slide in a vertical direction. An inverse-L-shaped protrusion 24 is provided in a lower portion of the second vertical moving block 20. A load cell 26 corresponding to load detecting means of a strain type is arranged on an upper surface of the protrusion 24, and the load cell 26 is brought into contact with a lower surface of the protrusion 14. Further, a cylinder 25 is downwardly mounted on a lower surface of the second vertical moving block 20, and a rod 25a of the cylinder 25 is brought into contact with an upper surface of the protrusion 24.

A bracket 30 having a C-shaped cross section is adhered to an upper portion of the second frame 23. A motor 31 is arranged on the bracket 30, and a rotational shaft of the motor 31 is connected to a perpendicular feed screw 27. The feed screw 27 is meshed with a nut 28 installed with in the second vertical moving block 20. Accordingly, when the motor 31 is normally and inversely rotated, the nut 28 vertically moves along the feed screw 27, and the second vertical moving block 20 and the first vertical moving block 10 move in a vertical direction. That is, the motor 31, the feed screw 27 and the nut 28 correspond to vertical moving means for vertically moving the thermal compression bonding tool 6 together with the first vertical moving block 10.

The motor 31 is connected to a vertical moving motor drive portion 33, and the vertical moving motor drive portion 33 controls a rotation of the motor 31 in response to an instruction from a control portion 34 and transmits a signal of a number or rotation in an encoder 32 to the control portion 34. A camera 37 is provided below the first frame 12. The camera 37 is provided with a mirror cylinder 36 projecting forward, and takes in an image of the electronic part 5 and the circuit board 3 by a lens mounted in a distal end of the mirror cylinder 36 at a time of forward moving (refer to reference numeral 37 shown by a chain line). An image recognizing portion 35 for recognizing positions of the electronic part 5 and the circuit board 3 is connected to the camera 37, and the image recognizing portion 35 is connected to the control portion 34. The image data taken in the camera 37 is transmitted to the image recognizing portion 35, and the position data of the recognized circuit board 3 and electronic part 5 are transmitted to the control portion 34.

Next, a relation between a pressing force applied to the electronic part 5 and a strain amount of the load detecting means will be described with reference to FIGS. 2A and 2B. FIG. 2A shows a motion of the load cell 26 corresponding to the load detecting means and the cylinder 25 in a state (A) that the compression bonding load is not acted thereon, and FIG. 2B shows a state (B) that the compression bonding load is acted thereon. In the state (A), the rod 25a of the cylinder 25 projects, thereby transmitting a predetermined projecting force F0 defined by an air pressure to the first vertical moving block 10. Further, in this state, an empty weight W of the first vertical moving block 10, the compression bonding head 7 mounted in the lower end portion thereof and the like is also applied to the load cell 26. That is, in a state that the compression bonding load is not acted thereon, the sum (F0+W) of the projecting force F0 due to the cylinder 25 and the empty weight W of the first vertical moving block 10 is applied to the load cell 26 as a pre-load f0.

On the contrary, at a time of compression bonding the electronic part 5 as shown by the reference symbol B, that is, in a state that a upward reaction force F of the compression bonding load is applied to the first vertical moving block 10 through the compression bonding tool 6, a detected load f of the load cell 26 is reduced at a degree of the reaction force F, so that f can be expressed by a formula F0+W−F. That is, the reduced value of the detected load f of the load cell 26 corresponds to a compression bonding load. Then, the load cell 26 extends at a displacement amount d corresponding to the reduced value of the detected load f.

Next, a description will be given to a phenomenon generated in the case that the compression load F is reduced or disappears in a state of fixing the height position of the compression bonding tool 6, that is, in a state that the height position of the second vertical moving block 20 shown in FIGS. 2A and 2B are fixed. This case corresponds to a case of changing from the state shown in B of FIG. 2B to A of FIG. 2A. That is, since the compression bonding load F is reduced or disappears, the load f applied to the load cell 26 is inversely increased, and the load cell 26 is compressed at a degree of this load increase, so that the first vertical moving block 10 and the compression bonding tool 6 disposed in the lower end portion thereof are displaced downward. Then, the displacement amount at this time is in proportion to the reduced value of the compression bonding load. That is, when the compression bonding load is reduced in a state of fixing the drive of the vertical moving means, the compression bonding tool 6 is descended at a strain amount of the load cell 26 corresponding to the reduced value.

The thermal compression bonding apparatus for the electronic part with the solder bump is structured in the above manner, and an operation thereof will be described below. In FIG. 1, the movable table 2 is driven so as to position the supply portion 4 of the electronic part 5 below the compression bonding tool 6. Next, the compression bonding tool 6 is descended so as to hold and pick up the electronic part 5 to the compression bonding tool 6 due to a vacuum adsorption. Next, the movable table 2 is again driven so as to position the circuit board 3 below the compression bonding tool 6, and in this state the camera 37 is moved forward so as to recognize the position of the circuit board 3 and the electronic part 5 held by the compression bonding tool 6. The circuit board 3 is positioned by the movable table 2 on the basis of the result of recognizing the position.

Thereafter, the compression bonding tool 6 is descended so as to press the electronic part 5 to the circuit board 3. A height position of the compression bonding tool 6, a detected load of the load cell 26 and a timing of turning on electricity to the heater at this time will be described below with reference to FIG. 3. In FIG. 3, a graph shown in an A portion shows a height position of the compression bonding tool 6 in the thermal compression bonding process, which is shown by setting a position at which the lower end portion of the bump 5a of the electronic part 5 is brought into contact with the electrode 3a of the circuit board 3 as a reference height. The B portion in FIG. 3 shows the reduced value of the detected load of the load cell 26, that is, the compression bonding load, and a C portion in FIG. 3 shows an ON-OFF timing of turning on and off electricity to the heater for heating the solder bump 5a of the electronic part 5 to a temperature equal to, or more than, a melting point of a solder.

At first, at a timing t0, the compression bonding tool 6 starts descending at a high speed, and at a timing t1, a descending speed is switched to a low speed. Thereafter, at a timing t2, one of the bumps 5a of the electronic part 5 is brought into contact with the electrode 3a, as shown in (A) portion in FIG. 3. As a result, an upward reaction force of the compression bonding load acts on the compression bonding tool 6 after a timing t2, the compression bonding load (the reduced value of the detected load of the load cell 26) is increased by further descending the compression bonding tool 6. Then, the second vertical moving block 20 is descended until the compression bonding load reaches a target load F1, so that all the bumps are securely brought into contact with the electrode 3a.

Next, at a timing t3' slightly before a timing t4 at which the bump 5a of the electronic part 5 is heated to a temperature equal to, or more than, a melting point of the solder by turning on electricity to the heater, the motor 31 is driven with holding the height of the compression bonding tool 6 so as to slightly ascend the second vertical moving block 20, so that the load pressing the electronic part 5 is set to a value equal to or less than a predetermined value F2 shown in the B portion. The predetermined value F2 is previously set by a trial as a load value such that an elastic strain of the load cell 26 due to the pressing load does not crush the melted solder bump 5a. Accordingly, a great part of the strain of the load cell 26 is released before the solder bump 5a is melted, and a residual strain left at a time of melting is widely reduced.

Next, at the timing 4, the heater is turned on electricity so as to heat the electronic part 5 through the compression bonding tool 6. As a result, the temperature of the bump 5a is increased and reaches a melting point of the solder at a timing t5, so that the bump 5a is melted. As a result, a reaction force of the compression bonding load which the electronic part 5 transmits to the compression bonding tool 6 almost disappears, and the compression bonding load is suddenly reduced for a short time from the timing t5 to a timing t6 as shown in the B portion. That is, a timing at which the bump 5a is melted can be detected by observing the load detected value of the load cell 26 corresponding to the load detecting means.

Further, the compression bonding tool 6 at this time descends at a degree of the elastic strain corresponding to the compression bonding load before melting (refer to the C ) portion in FIG. 3). However, since the compression bonding load is reduced to a value equal to, or less than, a predetermined load at a timing t3', the elastic strain is widely reduced and the descending amount of the compression bonding tool 6 is a little, so that a disadvantage such as the bump 5a is crushed as shown in the E portion in FIG. 3 is not generated.

As mentioned above, next, when the load detected value is reduced to a degree equal to or less than a predetermined value Fth (refer to the B portion in FIG. 3) set as a threshold value for confirming a disappearance of the compression bonding reaction force due to a melting of the solder, it is judged that the solder bump is melted so as to ascend the compression bonding tool 6 to a predetermined height at this timing t6. Then, the heater is turned off electrically at a timing t7 at which the compression bonding tool 6 reaches a predetermined height. Thereafter, a solder bonded portion formed in a hand drum shape as shown in a (iv) portion in FIG. 4 can be obtained by holding the compression bonding tool 6 at a predetermined height position till a timing t8 and cooling and solidifying the melted solder. A shape of a bonded stop end portion of the solder is made smooth by forming the solder bonded portion in this hand drum shape, so that a discontinuous portion is prevented from being generated so as to improve a break resistance and a solder bonded portion having an increased height can be obtained.

At this time, since the structure is made such as to immediately ascend the compression bonding tool 6 at the timing t6 at which the melting of the bump 5a is detected, it is unnecessary to wait a time-up of a supposed melting time set to be a little longer for a safe operation in accordance with a conventional method, so that a useless time that the compression bonding tool 6 waits as it is after the solder is melted can be omitted.

Thereafter, the compression bonding tool 6 ascends after releasing the electronic part 5, and is returned to an original position at a timing t9, so that a cycle of the thermal compression bonding of the electronic part with the solder bump is completed.

In accordance with the present invention, the structure is made such as to judge that the solder bump is melted when a load detected value by said load detecting means is reduced to a value equal to or less than a predetermined value after heating of said electronic part is started so as to ascend the thermal compression bonding tool, after descending the thermal compression bonding tool so as to press the solder bump of said electronic part to the electrode of the circuit board by a predetermined load, it is unnecessary to wait a time-up of a supposed melting time set to be a little longer in accordance with a conventional method, so that a useless time that the compression bonding tool waits as it is after the solder is melted can be omitted and a productivity can be improved.

In accordance with the present invention, the structure is made such as to drive said vertical moving means so that a strain of said load detecting means becomes a value equal to or less than a predetermined value before the solder bump is melted after descending the thermal compression bonding tool so as to press the solder bump of said electronic part to the circuit board, the strain due to the pressing load is released after the solder bump is melted and the descending amount when the compression bonding tool descends can be reduced at that degree corresponding to the strain, so that the crush of the solder bump caused by the compression bonding tool descending is not generated, and the a disadvantage of generation of the bridge, that is, the adjacent solder bumps are connected to each other, can be prevented.

What is claimed is:

1. A thermal compression bonding method of an electronic part with a solder bump, said method comprising the steps of:
   (a) pressing the electronic part with the solder bump to a circuit board by a thermal compression bonding tool;
   (b) vertically moving, by a vertical moving means, said electronic part to the circuit board and thermally compression bonding said electronic part to the circuit board while detecting a pressing force, by means for load detection,
   wherein step (b) includes the steps of descending the thermal compression bonding tool so as to press the solder bump of said electronic part to the electrode of the circuit board, and
   (c) judging that the solder bump is melted when a load value detected by said means for load detection is reduced to a value equal to or less than a predetermined value after heating of said electronic part is started so as to descend the thermal compression bonding tool.

2. A thermal compression bonding method of an electronic part with a solder bump, said method comprising the steps of:
   (a) pressing the electronic part with the solder bump to a circuit board by a thermal compression bonding tool;
   (b) vertically moving, by a vertical moving means, said electronic part to the circuit board and thermally compression bonding said electronic part to the circuit board while detecting a pressing forces by means for strain type load detection,
   wherein step (b) includes the steps of descending the thermal compression bonding tool so as to press the solder bump of said electronic part to the electrode of the circuit board, and
   (c) driving said vertical moving means so that a strain detected by said means for load detection becomes a value equal to or less than a predetermined value before the solder bump is melted, and after said means for load detection detects that said value is equal to or less than said predetermined value, melting the solder bump by heating said electronic part.

* * * * *